US006650021B2

(12) United States Patent
Stamper et al.

(10) Patent No.: US 6,650,021 B2
(45) Date of Patent: Nov. 18, 2003

(54) RECESSED BOND PAD

(75) Inventors: Anthony K. Stamper, Williston, VT (US); Sally J. Yankee, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 3 days.

(21) Appl. No.: 10/005,951

(22) Filed: Dec. 3, 2001

(65) Prior Publication Data

US 2002/0053746 A1 May 9, 2002

Related U.S. Application Data

(62) Division of application No. 09/564,626, filed on May 4, 2000, now Pat. No. 6,362,531.

(51) Int. Cl.[7] .................... H01L 23/48; H01L 23/52; H01L 29/40
(52) U.S. Cl. .................. 257/786; 257/780; 257/781; 257/784; 257/773; 257/690; 257/758; 257/774; 438/618; 438/666
(58) Field of Search .................. 257/786, 781, 257/784, 773, 700, 780, 690, 758

(56) References Cited

U.S. PATENT DOCUMENTS

| | | | |
|---|---|---|---|
| 4,622,574 A | | 11/1986 | Garcia |
| 5,731,222 A | | 3/1998 | Malloy et al. |
| 5,783,868 A | | 7/1998 | Galloway |
| 6,150,725 A | * | 11/2000 | Misawa et al. ............. 257/781 |
| 6,297,563 B1 | * | 10/2001 | Yamaha ..................... 257/781 |
| 6,313,537 B1 | * | 11/2001 | Lee et al. .................. 257/758 |
| 6,337,266 B1 | * | 1/2002 | Zahorik .................... 438/618 |
| 6,420,254 B1 | * | 7/2002 | Stamper et al. ........... 438/612 |
| 6,522,021 B2 | * | 2/2003 | Sakihama et al. ......... 257/784 |

OTHER PUBLICATIONS

Elimination of Bond–pad Damage Through Structural Reinforcement of Intermetal Dielectrics, Saran et al., Mar. 31, 1998, pp. 225–231.

* cited by examiner

Primary Examiner—Steven Loke
Assistant Examiner—Nitin Parekh
(74) Attorney, Agent, or Firm—Schmeiser, Olsen & Watts; William D. Sabo

(57) ABSTRACT

A recessed bond pad within an electronic device on a substrate, and associated method of fabrication. The electronic device includes N contiguous levels of interconnect metallurgy, with level N coupled to the substrate. A first group of metallic etch stops is formed at level $M \leq N$, and a second group of metallic etch stops is formed at level $M-1$. The second group conductively contacts the first group in an overlapping multilevel matrix pattern. A recessed copper pad is formed at level $K \leq M-2$. A cylindrical space that encloses the metal pad encompasses levels $1, 2, \ldots, M-1$ above the first group, and levels $1, 2, \ldots, M-2$ above the second group. Dielectric material in the cylindrical space is etched away, leaving a void supplanting the etched dielectric material, and leaving exposed surfaces of the cylindrical space. The copper pad is exposed and recessed within the cylindrical space. An aluminum layer is conformally formed to encapsulate the exposed copper pad, to protect the copper pad from oxidation. The recessed bond pad includes the copper pad and the encapsulating aluminum layer. A blanket is formed that covers remaining exposed surfaces of the cylindrical space while leaving a portion of the aluminum layer of the bond pad exposed. The blanket protects the surfaces from oxidation, contaminants, and mechanical stress. The recessing of the bond pad prevents force applied to a wirebond on the bond pad from being transmitted to dielectric material within the substrate.

12 Claims, 12 Drawing Sheets

RECESSED BOND PAD

This application is a divisional Ser. No 09/564,626 filed May 4, 2000 now U.S. Pat. No. 6,362,531.

BACKGROUND OF THE INVENTION

1. Technical Field

The present invention relates to a recessed bond pad within an electronic device, and an associated method of fabrication.

2. Related Art

An electronic device, such as a semiconductor chip, typically has a bond pad on its exterior surface for placement of a conductive interconnect, such as a wirebond. A force applied to the wirebond in the direction of the bond pad ensures that the wirebond makes a reliable connection with the bond pad. Such force to the wirebond propagates into the electronic device and such force must consequently be withstood by material structures within the electronic device below the wirebond, including dielectric structures within the electronic device.

With successive generations of electronic devices, wiring density within electronic devices has been increasing. The increased wiring density, and consequent shorter distances between conductive wires, unfortunately leads to increased undesired capacitance between, and within, wiring levels for given dielectric materials between the conductive wires. A method of preventing the aforementioned decrease in undesired capacitance includes using dielectric materials having lower dielectric constants to an extent necessary to compensate for the reduced spacing between conductive wires. Candidate materials having lower dielectric constants, however, tend to be more porous, and thus mechanically weaker, than mechanically stronger dielectric materials currently being used in electronic devices. Unfortunately, such mechanically weak dielectric materials are unable to withstand the aforementioned forces applied to wire pads during wirebond, testing, or solder bumping and are thus not viable candidates for reducing capacitance so long as they are must bear the forces applied to wirebonds or test probes.

A method is needed for enabling mechanically weak dielectric materials having low dielectric constants to be utilized in an electronic device coupled to a wirebond or test probes, such that forces applied to the wire pads are not transmitted to the mechanically weak dielectric materials.

SUMMARY OF THE INVENTION

The present invention provides an electronic device, comprising:
  a substrate;
  a system of N contiguous levels of interconnect metallurgy on the substrate, wherein each level is formed at a different elevation above the substrate, wherein level N is coupled to the substrate, and wherein N is a positive integer of at least 3;
  a first group of metallic etch stops at level M, wherein M is an integer no less than 3 and no greater than N;
  a second group of metallic etch stops at level M−1, wherein the second group of metallic etch stops conductively contacts the first group of metallic etch stops in an overlapping multilevel matrix pattern;
  a cylindrical space that encompasses:
    levels 1, 2, . . . , M−1 above the first group of metallic etch stops, and levels 1, 2, . . . , M−2 above the second group of metallic etch stops; and
  a bond pad within the first cylindrical space, wherein the bond pad is substantially formed at level K, wherein K is a positive integer of at least 1 and no greater than M−2, wherein the bond pad is conductively coupled to both the first group of metallic etch stops and the second group of metallic etch stops, and wherein the bond pad includes a surface having an exposed portion.

The present invention provides an electronic device, comprising:
  a substrate;
  a system of N contiguous levels of interconnect metallurgy on the substrate, wherein each level is formed at a different elevation above the substrate, wherein level N is coupled to the substrate, and wherein N is a positive integer of at least 2;
  a group of metallic etch stops at level M, wherein M is an integer no less than 2 and no greater than N;
  a cylindrical space that encompasses levels 1, 2, . . . , M−1 above the group of metallic etch stops; and
  a bond pad within the cylindrical space, wherein the bond pad is substantially formed at level K, wherein K is a positive integer of at least 1 and no greater than M−1, wherein the bond pad is conductively coupled to the group of metallic etch stops, and wherein the bond pad includes a surface having an exposed portion.

The present invention provides an electronic device, comprising:
  a substrate;
  a system of N contiguous levels of interconnect metallurgy for interconnecting semiconductor devices, wherein the system is on the substrate such that level N is coupled to the substrate, wherein N is a positive integer of at least 2, and wherein each level is formed at a different elevation above the substrate;
  a plurality of bond pads coupled to the system, wherein at least one of said bond pads is substantially formed at level M, and wherein M is a positive integer less than N.

The present invention provides a method for forming an electronic device having a recessed bond pad, comprising the steps of:
  providing a substrate and a system of N contiguous levels of interconnect metallurgy on the substrate,
    wherein each level is formed at a different elevation above the substrate,
    wherein N is a positive integer of at least 3,
    wherein level N is coupled to the substrate,
    wherein a first group of metallic etch stops is formed at level M,
    wherein M is an integer no less than 3 and no greater than N,
    wherein a second group of metallic etch stops is formed at level M−1,
    wherein the second group of metallic etch stops conductively contacts the first group of metallic etch stops in an overlapping multilevel matrix pattern,
    wherein a metal pad is formed at level K,
    wherein K is a positive integer of at least 1 and no greater than M−2,
    wherein a cylindrical space encompasses levels 1, 2, . . . , M−1 above the first group of metallic etch stops, and levels 1, 2, . . . , M−2 above the second group of metallic etch stops, and
    wherein the cylindrical space includes dielectric material and encloses the metal pad,
  etching away the dielectric material in the cylindrical space, leaving a void that supplants the etched dielectric material, leaving exposed surfaces of the cylindrical space, and leaving the metal pad exposed; and forming a conductive layer around the exposed metal pad, wherein the conductive layer includes a conductive metal, and wherein the bond pad includes the conductive layer and the metal pad.

The present invention has the advantage of enabling mechanically weak dielectric materials having low dielectric constants to be utilized in an electronic device coupled to a wirebond, such that forces applied to the wirebonds are not transmitted to the mechanically weak dielectric materials.

The present invention has the advantage of utilizing an overlapping multilevel matrix pattern of metallic etch stops, which enables the dimensions of individual etch stops to be limited. It is desirable to limit the width of the individual etch steps to a single width because the photolithography, reactive ion etching (RIE), metal fill, and subsequent processes can be optimized for a single line width.

DETAILED DESCRIPTION OF THE INVENTION

Figure 1:
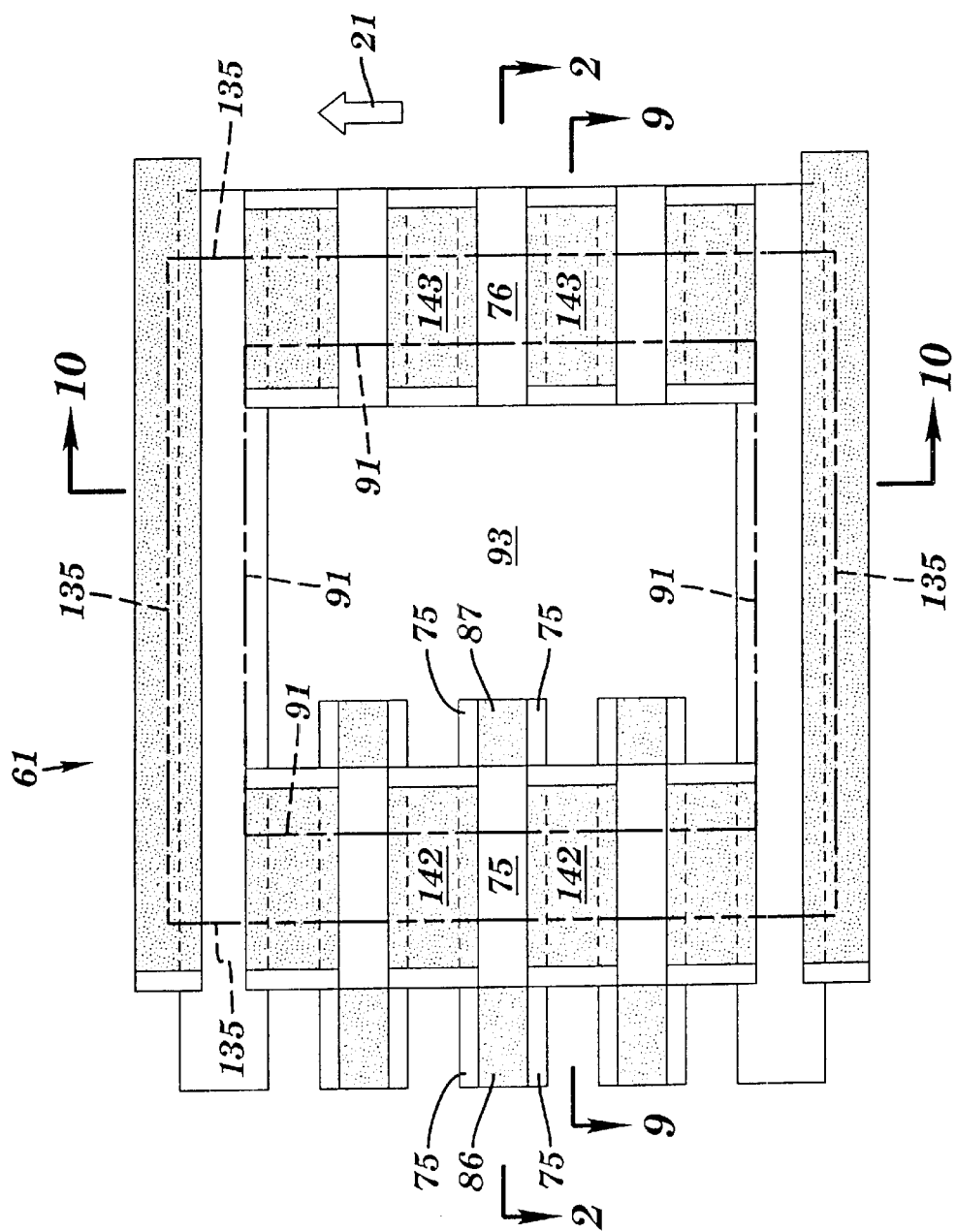
FIG. 1 depicts a top view of portions of an electronic device, in accordance with a preferred embodiment of the present invention.
Figure 9:
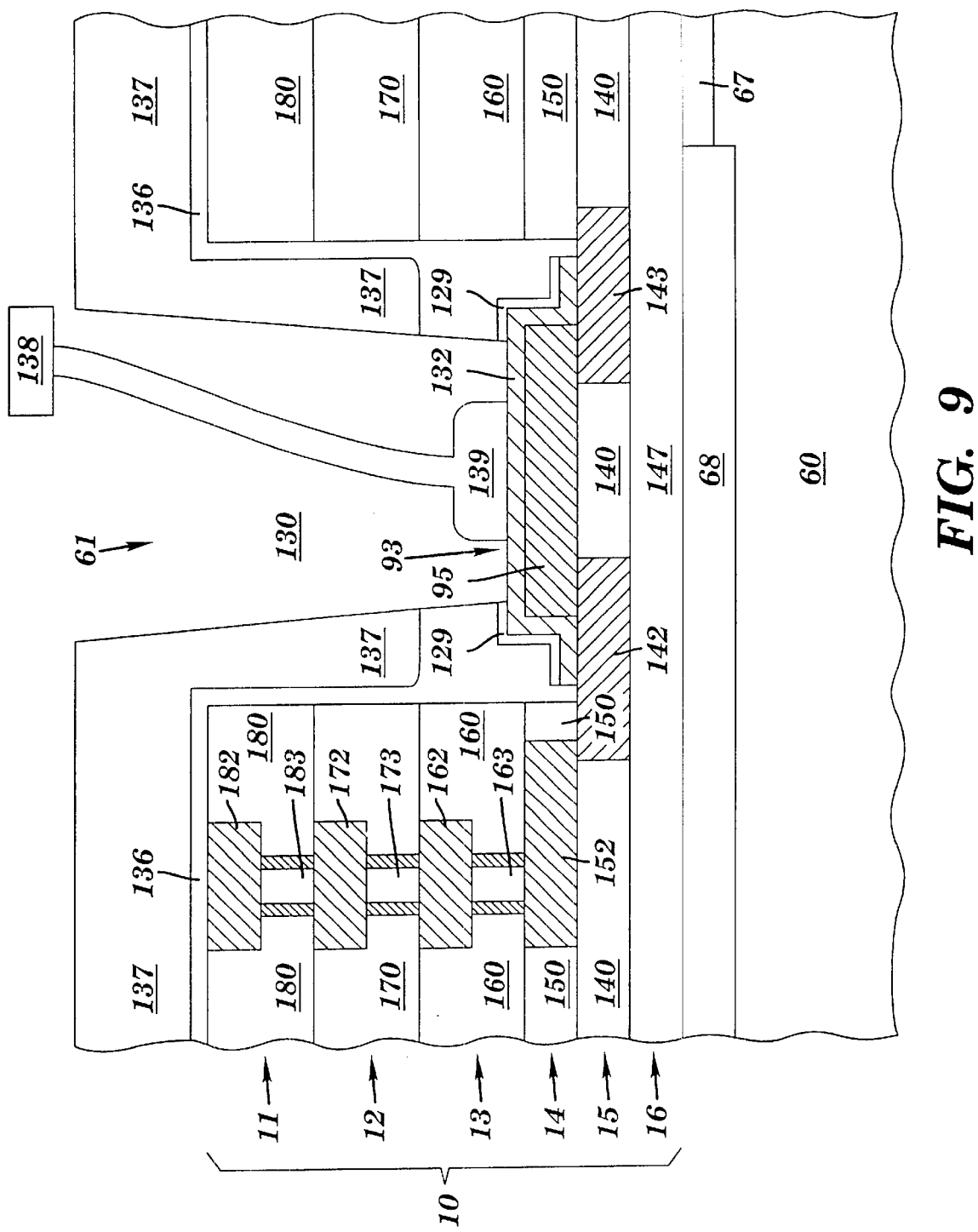
FIG. 9 depicts a cross-sectional view taken along line 9—9 of FIG. 1, showing the electronic device having a recessed bond pad.
Figure 10:
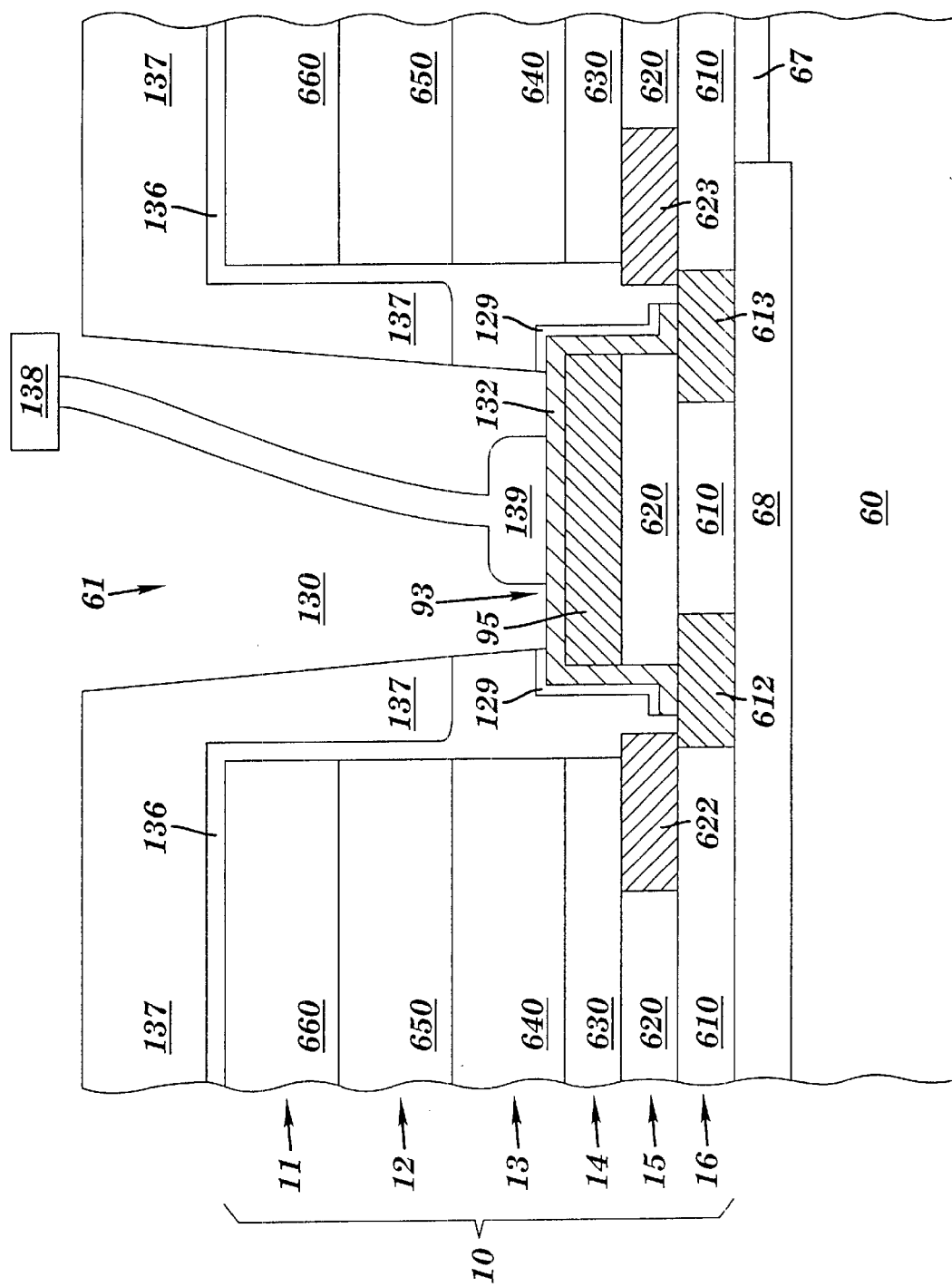
FIG. 10 depicts a cross-sectional view taken along line 10—10 of FIG. 1, showing the electronic device having a recessed bond pad.

FIG. 1 illustrates a top view of portions of an electronic device 61, in accordance with a preferred embodiment of the present invention. FIGS. 2–8 illustrates a cross-sectional view taken along line 2—2 of FIG. 1 ("view 2—2"). FIG. 9 illustrates a illustrates a cross-sectional view taken along line 9—9 of FIG. 1 ("view 9—9"). FIG. 10 illustrates a illustrates a cross-sectional view taken along line 10—10 of FIG. 1 ("view 10—10").

Noting that the levels 15 and 16 of the electronic device 61 shown and defined in FIGS. 2–10, the diagonally-lined regions in FIG. 1, including regions 86, 87, 142, and 143, are metallic regions on level 15. Included among other regions not diagonally lined, such as regions 75 and 76, are metallic regions on the "lower" adjacent level 16. Levels 15 and 16, as shown in FIGS. 2–9, are adjacent levels of the electronic device 61 and will be described in detail in the discussion infra accompanying FIGS. 2–10. The closed square path 91 in FIG. 1 is an outer boundary of a bond pad 93 that is at level 14 adjacent to, and "above" level 15, as shown in FIG. 2–10. The closed square path 135 in FIG. 1 is a rectangular outer boundary of a cylindrical space 130 (not labeled in FIG. 1, but labeled as "130" in FIGS. 3–10) that surrounds the square path (outer boundary) 91 of the bond pad 93.

In FIG. 1, the regions 142 and 143 on level 15, and regions 75 and 76 on the adjacent "lower" level 16, include "metallic etch stop" material. A "metallic etch stop" (also called a "metal etch stop") at a given level is a solid metal volume at the given level that does not etch away when exposed to a given etchant. Thus, a particular metallic material may serve as an etch stop for one etchant but not for another etchant. An metallic etch stop is typically interposed between the etchant and other material (e.g., silicon) that is vulnerable to undesired attack by the etchant. Thus by resisting being etched, the metallic etch stop serves to prevent the etchant from attacking the other vulnerable material. For etchants, such as fluorocarbons (e.g., $CF_4$, $C_2F_6$, $C_4F_8$), and hydrocarbons (e.g., $CH_3$, $C_2H_2$), employed for etching commonly used dielectric materials, such as $SiO_2$, $Si_3N_4$, and SiC, in semiconductor structures, tungsten has been found to be an effective metallic etch stop.

Of significance in the etch stop scheme of the present invention, is that the metallic etch stop 75 on level 16 mechanically and conductively overlaps the metallic etch stop 142 on the adjacent higher level 15, wherein said overlap is in the direction 21, as shown in FIG. 1. Similarly, the metallic etch stop 76 on level 16 mechanically and conductively overlaps the metallic etch stop 143 on the adjacent higher level 15, wherein said overlap is in the direction 21, as shown in FIG. 1. Because of these overlaps and as explained in more detail in the discussion infra accompanying FIG. 9, there are no spatial pathways to a substrate 60 (see FIGS. 2–9) through the etch stops, thus preventing the substrate 60 from being etched. The substrate 60 may include silicon and would thus be otherwise subject to undesired etching in the absence of the present invention. Thus, the metallic etch stops 75 and 142, together with metallic etch stops 76 and 143, form an overlapping multi-level matrix pattern that constitutes an effective composite etch stop for the etching process to be described supra in connection with FIG. 3.

Figure 2:
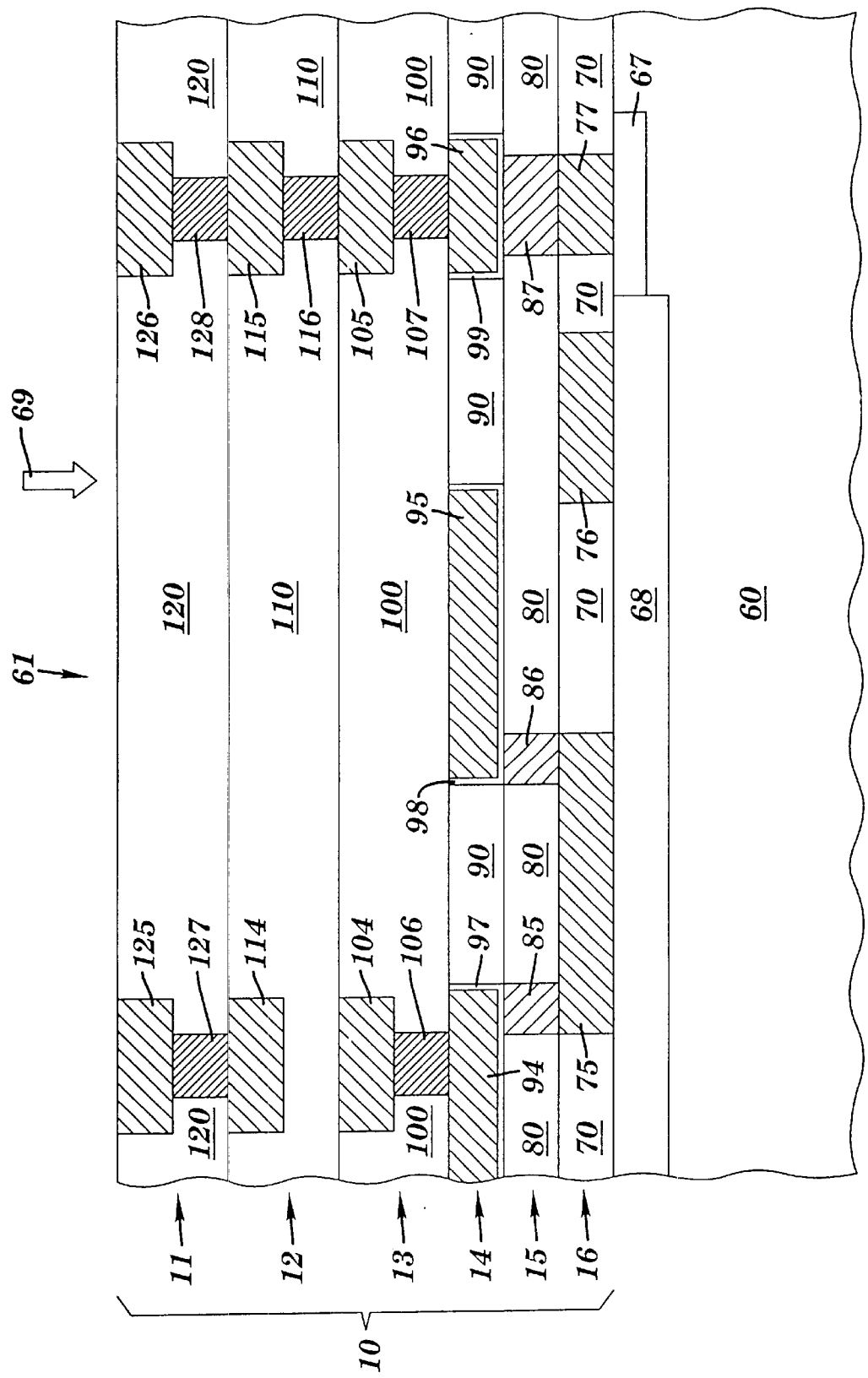
FIG. 2 depicts a cross-sectional view taken along line 2—2 of FIG. 1, showing the electronic device having dielectric material encapsulating a metal pad.

FIG. 2 illustrates a cross-sectional view taken along line 2—2 of FIG. 1 ("view 2—2"), showing the electronic device 61 as having dielectric material encapsulating a metal pad 95. FIG. 2 includes a system 10 of 6 contiguous levels of interconnect metallurgy on a substrate 60, such as a silicon substrate. The 6 contiguous levels are each formed at a different elevation above the substrate 60. The 6 contiguous levels include levels 11, 12, 13, 14, 15, and 16 in order of decreasing elevation above the substrate 60, wherein level 16 is coupled to the substrate 60, and level 11 is furthest from the substrate 60. A level of interconnect metallurgy comprises dielectric material and may also comprise at least one conductive structure that serves as an electrical conductor through the total thickness of the level. An example of a conductive stricture at the level is a solid metal block extending through the entire thickness of the level. A second example of a conductive structure at the level is a via filled with a conductive metal, wherein the via extends through the entire thickness of the level A third example of a conductive structure at the level is a dual-damascene metal-filled via mechanically and conductively coupled to a metal wire or pad, wherein the via-pad combination extends through the entire thickness of the level. A conductive structure at a given level is capable of conductively interconnecting (i.e., conductively interfacing) with a conductive structure at another level contiguous with the given level.

A top portion of the substrate 60 includes a shallow trench isolation (STI) 68 filled with $SiO_2$ or another low leakage insulator for providing insulative separation between portions of the substrate 60, such as between diffusions (i.e., N-type or P-type diffusions). See, for example, the diffusion region 67 in FIG. 2.

In FIG. 2, level 16 includes a dielectric region 70 and metallic etch stops 75 and 76. The STI could also consist of a furnace grown $SiO_2$ or any deposited insulator. A dielectric region is a region that includes a dielectric material. The dielectric material of the dielectric region 70 preferably includes variants of doped $SiO_2$, such as boron and phosphorus doped $SiO_2$ (BPSG), phosphorus doped $SiO_2$ (PSG), and fluorine-doped BPSG (FBPSG). As stated supra, a metallic etch stop (also called a "metal etch stop") at a given level is a solid metal block at the given level that does not etch away when exposed to an etchant that etches away dielectric material located directly above the given level. The metallic etch stops 75 and 76 each preferably include tungsten. Region 77 is a metal region that may be made of the same material that the metallic etch stops 75 and 76 are made of, or may be made of different metallic material.

Level 15 includes a dielectric region 80 and metal regions 85, 86, and 87. The dielectric material of the dielectric region 80 preferably includes $SiO_2$ or PSG. The metal regions 85, 86, and 87 include any conductive metal and preferably include tungsten. Note that the metallic etch stops 75 and 76 of level 16 are etch stops with respect to the portions of the dielectric region 80 which are directly on top of the metallic etch stops 75 and 76. If the metal etch stops on levels 15 and 16 are fabricated using damascene processing, then preferably the damascene trenches would be coated with one or more of a refractory metal, a refractory metal nitride, or a refractory metal silicide (e.g., Ti, TiN, Ti and TiN, Ta, TaN, Ta and TaN), and then filled with a refractory metal, refractory metal nitride, or refractory metal silicide (e.g., W, $WN_x$, or $WSi_x$. The preferred embodiment would use about 10 nm of Ti followed by filling with tungsten.

Level 14 includes a dielectric region 90, and metal pads and wires 94, 95, and 96 conductively coupled to the metal regions 85, 86, and 87, respectively, of level 15. The dielectric region 90 may include a mechanically strong dielectric material such as $SiO_2$. Nonetheless, the present invention makes it feasible for the dielectric region 90 to include a mechanically weak dielectric material having a low dielectric constant k, wherein such low-k dielectric material may be needed for reducing or eliminating undesired capacitance between closely spaced conductive regions within the contiguous levels of the electronic device 61. Such mechanically weak dielectric materials may have k<3 (e.g., polyarylene ether, silica aerogel, hydrogen silsesquioxane (HSQ), methyl silsesquoixane (MSQ), $SiC_xO_yH_z$, etc.). Such mechanically weak dielectric materials may also have even lower dielectric constants such as k<2 (e.g., aerogels, "TEFLON", air bridges). Noting that the metal pad and wire 95 will become part of a recessed bond pad of the present invention by the process steps to be described infra, a downward-directed force in the direction 69 on a conductive interconnect (such as a wirebond or a solder bump) that is coupled to the bond pad (and thus on the metal pad and wire 95) can be transmitted only to dielectric material below the metal pad and wire 95, such as to the dielectric material of dielectric regions 80 and 70 of levels 15 and 16, respectively. In particular, a downward-directed force on a conductive interconnect cannot be transmitted to the dielectric material of dielectric region 90 of the same level 14 of the metal pad and wire 95, or to dielectric material at the higher levels 13, 12, and 11. The metal pads and wires 94, 95, and 96 each include any conductive metal, and preferably include copper. The level 14 may also include conductive liners 97, 98, and 99 partially encapsulating the metal pads and wires 94, 95, and 96, respectively, as shown. The conductive liners 97, 98, and 99 serve to prevent metal ions (e.g., copper ions) in the metal pads and wires 94, 95, and 96, respectively, from diffusing into adjacent regions. The conductive liners 97, 98, and 99 include, inter alia, a metal (e.g., tantalum, titanium, tungsten), a nitride of the metal, or a combination of metals and nitrides of the metals. Examples include: titanium nitride; tantalum and tantalum nitride.

Level 13 includes a dielectric region 100. As with level 14, the dielectric region 100 may include a mechanically strong dielectric material or a mechanically weak dielectric material. Level 13 also preferably includes a plated via 106 (e.g., a copper plated via) conductively coupled to a metal pad and wire 104, wherein the plated via 106 is also conductively coupled to the metal pad and wire 94 of level 14. Level 13 further includes a plated via 107 (e.g., a copper plated via) conductively coupled to a metal pad and wire 105, wherein the plated via 107 is also conductively coupled to the metal pad and wire 96 of level 14. The metal pads and wires 104 and 105 include each any conductive metal, and preferably include copper. The metal pads and wires 104 and 105 may also each include a conductive liner (not shown) such as any of the conductive liners 97, 98, and 99 of level 14. The plated vias between wiring levels (e.g., the plated via 106 between the metal pad and wire 104 and metal pad and wire 94; the plated via 107 between the metal pad and wire 105 and metal pad and wire 96) could consist of any conductor (e.g., tungsten) which would be processed using single damascene.

Level 12 includes a dielectric region 110. As with level 14, the dielectric region 110 may include a mechanically strong dielectric material or a mechanically weak dielectric material. Level 12 also includes a metal pad and wire 114, wherein the metal pad is not conductively coupled to level 13, which illustrates that conductive paths may terminate anywhere within the system 10. Level 13 further includes a plated via 116 (e.g., a copper plated via) conductively coupled to a metal pad and wire 115, wherein the plated via 116 is conductively coupled to the metal pad 105 of level 13. The metal pad and wire 115 includes any conductive metal, and preferably includes copper. The metal pad and wire 115 may also include a conductive liner (not shown) such as any of the conductive liners 97, 98, and 99 of level 14.

Level 11 includes a dielectric region 120. As with level 14, the dielectric region 120 may include a mechanically strong dielectric material or a mechanically weak dielectric material. Level 11 also includes a plated via 127 (e.g., a copper plated via) conductively coupled to a metal pad and wire 125, wherein the plated via 127 is also conductively coupled to the metal pad 114 of level 12. Level 11 further includes a plated via 128 (e.g., a copper plated via) conductively coupled to a metal pad and wire 126, wherein the plated via 128 is conductively coupled to the metal pad and wire 115 of level 12. The metal pads and wires 125 and 126 each include any conductive metal, and preferably include copper. The metal pads and wires 125 and 126 may also each include a conductive liner (not shown) such as any of the conductive liners 97, 98, and 99 of level 14.

Figure 3:
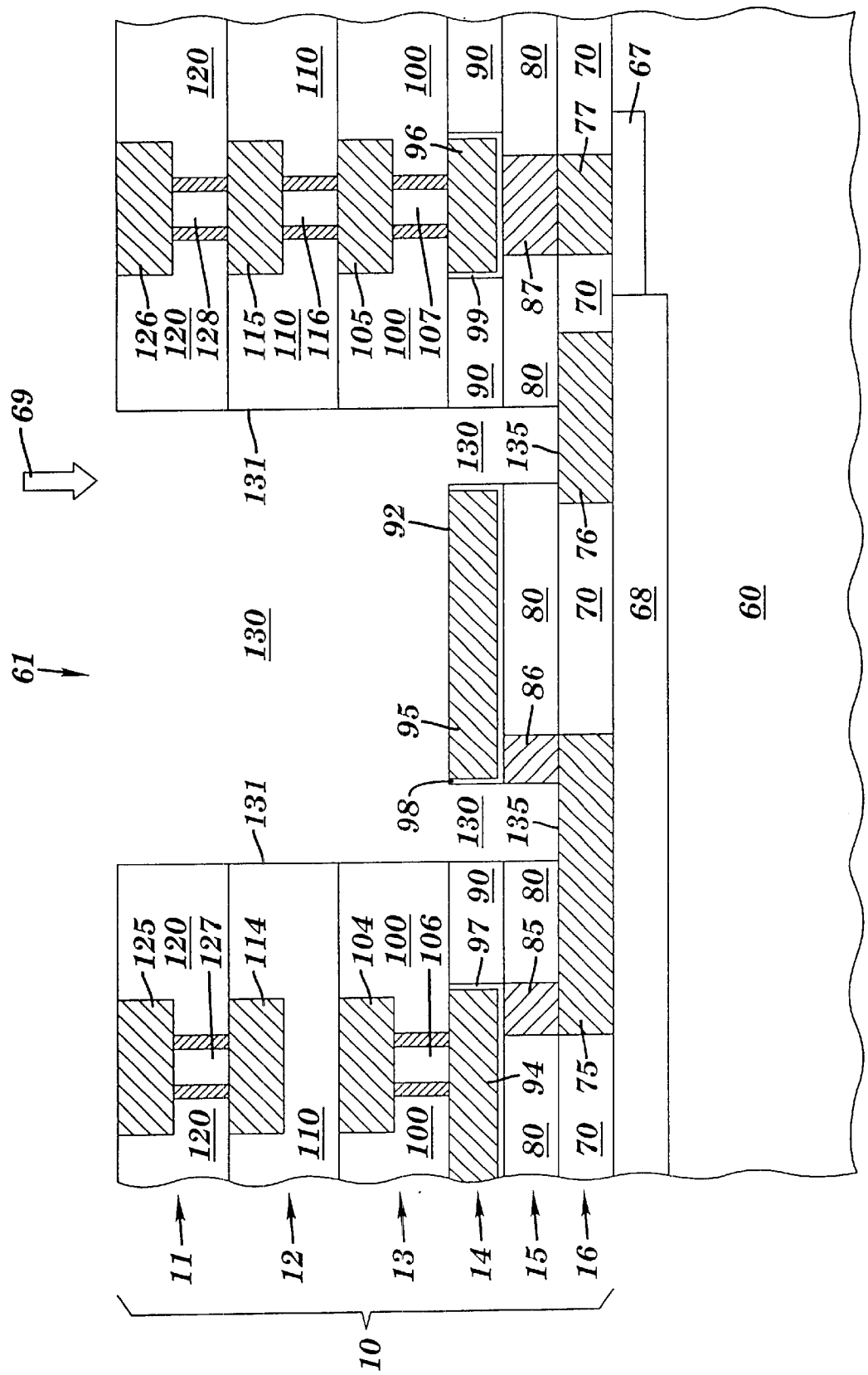
FIG. 3 depicts FIG. 2 after dielectric material has been etched away to create a cylindrical space around the metal pad.

FIG. 3 illustrates FIG. 2 after dielectric material has been etched away, by any known method such as photolithographic masked etching, from dielectric regions 120, 110, 100, 90, and 80 to create a cylindrical space 130 around the metal pad 95 such that a top surface 92 of the metal pad 95 is exposed. The phrase "cylindrical volume" is intended to have the same meaning as the phrase "cylindrical space." The cylindrical space 130 extends through layers 11, 12, 13, 14, and 15. The etching is performed as an anisotropic etching in the direction 69 in order to create vertical or nearly vertical (slope>60 degrees) sidewalls 131 of the cylindrical space 130, and also to prevent undercutting (i.e., etching below) the metal pad 95. The cylindrical space 130 has a cross-sectional geometric shape that is preferably rectangular as shown by the outer boundary 135 in FIG. 1, but may also any have other geometric shape such as a circular, elliptical, or hexagonal shape. To etch the opening, a standard dielectric RIE process using perfluorocarbons, hydrofluorocarbons, argon, oxygen, etc. gas would be used, as known in the art. If one or more of the dielectrics in layers 11, 12, 13, 14, or 15 are composed of different dielectrics, such as $SiO_2/Si_3N_4$ or polyarylene ether/$Si_3N_4$ for example, with different etch properties, then the RIE chemistry would need to be changed during the RIE process as each layer was etched.

The aforementioned etching should be implemented in a way that prevents the etchant from etching into the substrate 60. The metallic etch stops 75 and 76 each include a material, such as tungsten, that resists being etched, which confines the etchant to levels above level 16; i.e., levels 15, 14, 13, 12, and 11. In that manner, the metallic etch stops 75 and 76 in level 16 appear to act as etch stops to effectively prevent the etchant from reaching the substrate 60. Nonetheless, it should be recalled that FIG. 3 is merely vertical cross-sectional slice through the electronic device 61; i.e., view 2—2 shown in FIG. 1. Thus, the question arises as to whether there is effective etch stopping for all such relevant vertical cross-sectional slices through the electronic device 61. The discussion infra accompanying FIG. 1 demonstrated that the preceding question has an affirmative answer in light of etch stop properties associated with another vertical cross sectional slice, namely the view 9—9 shown in FIG. 1 and the associated overlapping multilevel matrix pattern, which will be discussed further in conjunction with FIG. 9.

Figure 4:
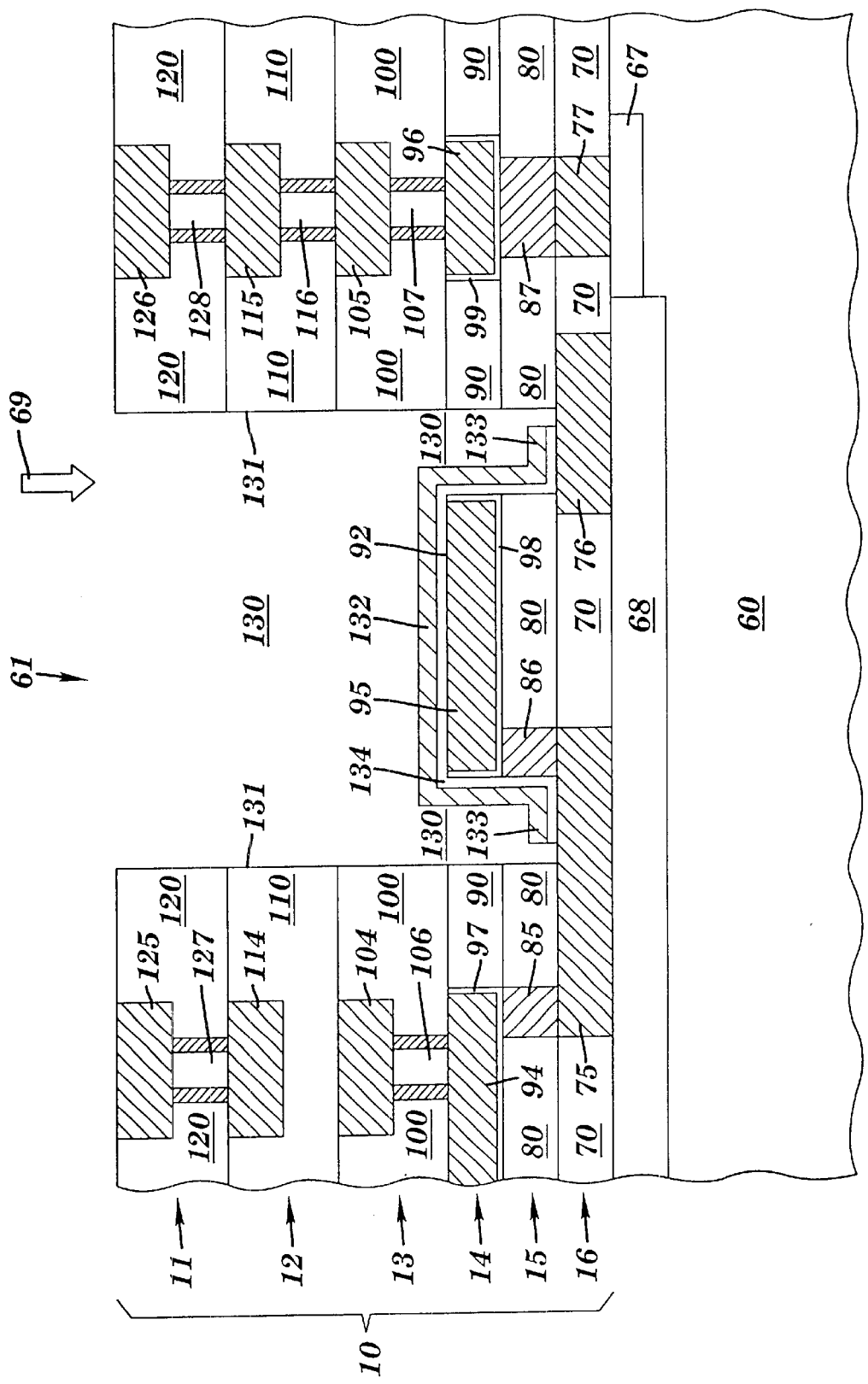
FIG. 4 depicts FIG. 3 after conformally forming a conductive layer around the metal pad.

FIG. 4 illustrates FIG. 3 after a conductive layer 132 has been conformally formed over the metal pad 95. The conductive layer 132 layer may be needed to shield the metal pad 95 from oxidation inasmuch as the metal pad 95 may include a metal, such as copper, that oxidizes upon exposure to air. The conductive layer 132 layer may also be needed to enable a connective interconnect, such as a wirebond, to be mechanically attached to the surface 92 of the metal pad 95 inasmuch as the metal pad 95 may include a metal, such as copper, that does not bond well with the wirebond. The conductive layer 132 preferably includes aluminum, such as in a composition of $AlCu_x$, wherein Cu constitutes about 1% of $AlCu_x$ by atomic weight percent (i.e., x is ~0.01). The conductive layer 132 may be formed by any method known to one of ordinary skill in the art, such as by depositing an $AlCu_x$ film using PVD, lithographically patterning to form a pad, reactive ion etching the $AlCu_x$ film, stripping the photoresist, and cleaning the wafer. Note that the conductive layer 132 has been formed in a manner that leaves the metallic etch stops 75 and 76 exposed, although the conduction layer 132 could encompass the entire width of the cylindrical space 130, if desired.

A conductive film 134 may be formed under the conductive layer 132 to serve any of several purposes. A first purpose is to enhance adhesion between the conductive layer 132 and the metal pad 95. A second purpose is to act as a diffusion barrier between the conductive layer 132 and the metal pad 95. For example, if the metal pad 95 includes copper and the conductive layer 132 includes aluminum, then by inhibiting diffusion, the conductive film 134 would prevent the copper of the metal pad 95 from reacting with the aluminum of the conductive layer 132 to form a precipitate, or vice versa (i.e., prevent the aluminum of the conductive layer 132 from reacting with the copper of the metal pad 95 to form a precipitate). A suitable material for the conductive film 134 includes, inter alia, tantalum nitride by itself or in combination with other elements (e.g., Ti, TiN, Ta, $TiAl_3$). An example composition for the conductive film 134 is a layered structure that includes: 40 nm of tantalum nitride, 15 nm of titanium, 15 nm of titanium nitride, and 1.5 microns of $AlCu_x$. The conductive film 134 may be formed by any method known to one of ordinary skill in the art, such as by PVD.

Figure 5:
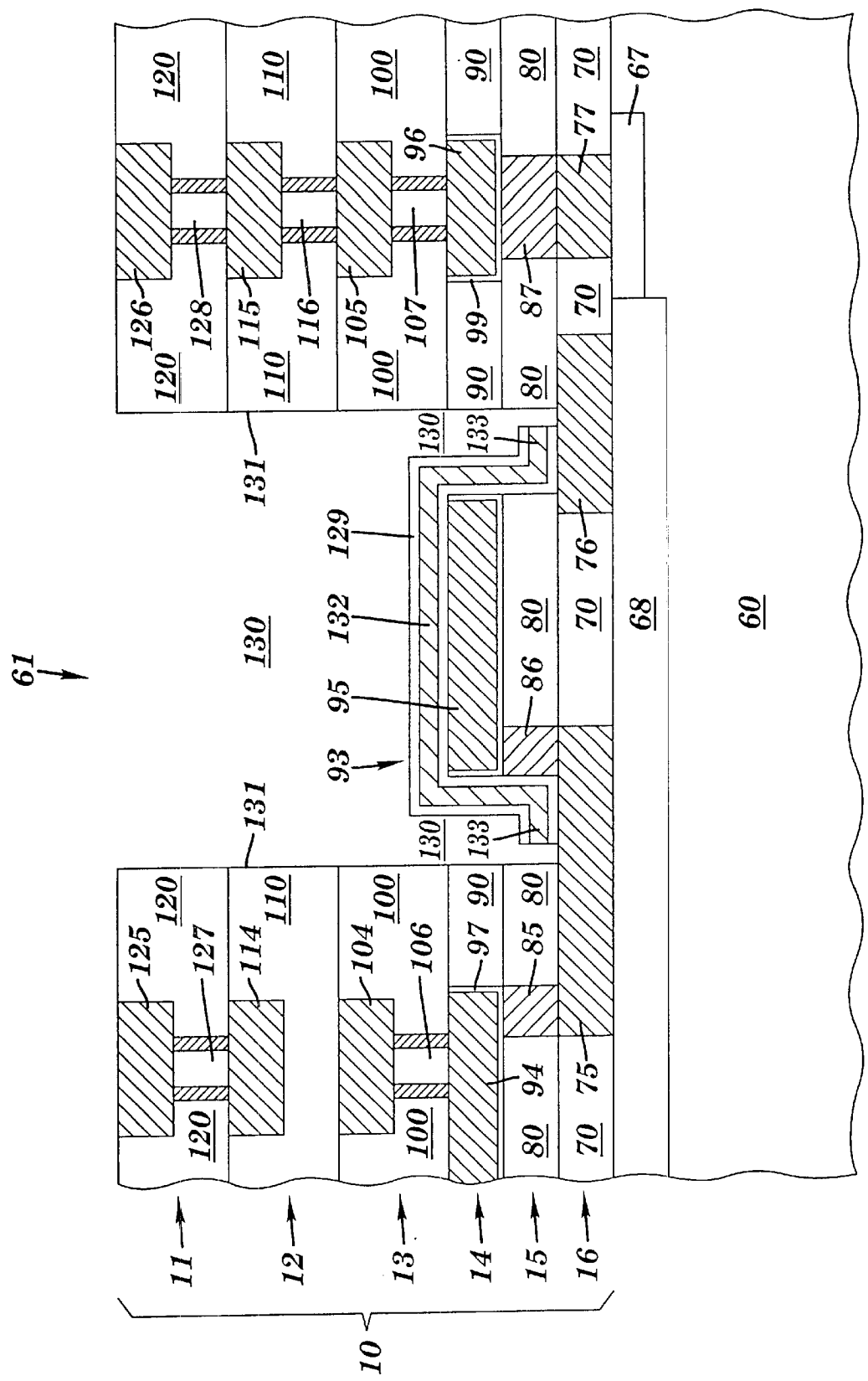
FIG. 5 depicts FIG. 4 after thin protective layer has been deposited on the conductive layer.

FIG. 5 illustrates FIG. 4 after a thin (e.g., 40 nm) protective layer 129 has been deposited on the conductive layer 132 prior to the lithographic patterning and etching (i.e., prior to patterning with resist, etching, resist stripping, and post-resist strip cleaning) discussed supra. The protective layer 129 includes, for example, a refractory metal, a refractory metal nitride, or a dielectric such as $SiO_2$. The protective layer 129 protects the aforementioned etching-related process steps from etching or oxidizing the conductive layer 132.

Figure 6:
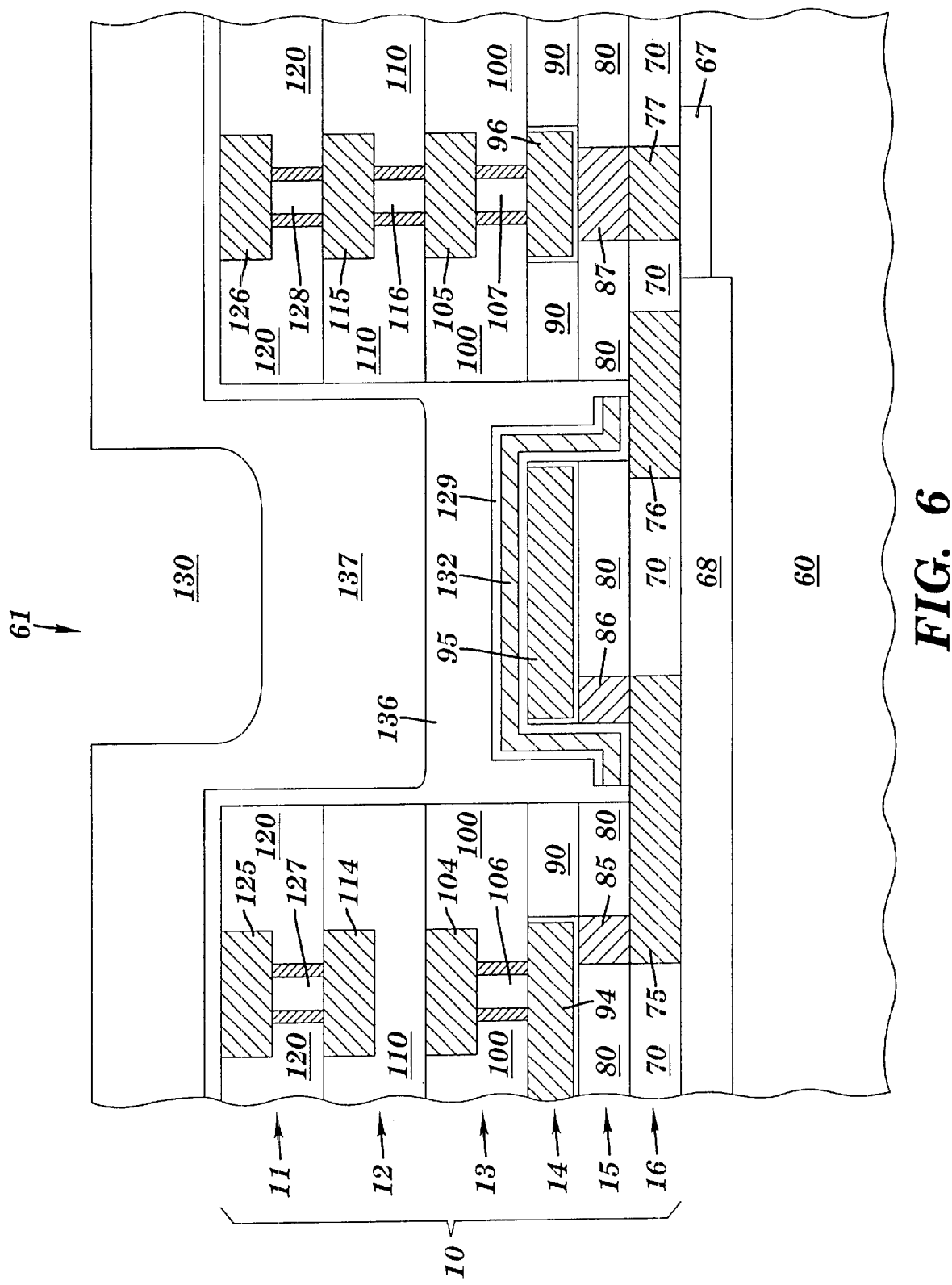
FIG. 6 depicts FIG. 5 after a nitride-oxide-nitride stack and a polyimide layer have covered otherwise exposed surfaces within the cylindrical space.

FIG. 6 illustrates FIG. 5 after a nitride-oxide-nitride stack 136 (or more specifically, a first nitride-oxide-second nitride stack 136) has been formed on exposed surfaces of the electronic device 61, and after a polyimide layer 137 has been formed on the nitride-oxide-nitride stack 136. The first nitride is the layer of the nitride-oxide-nitride stack 136 that adheres to the otherwise exposed surfaces of the electronic device 61. The nitride-oxide-nitride stack 136, together with the polyimide layer 137, constitutes a protective blanket over otherwise exposed surfaces. The first nitride in the nitride-oxide-nitride stack 136 is required only if the oxide in the nitride-oxide-nitride stack 136 will not adhere well to the last metal of the surfaces of the electronic device 61 on which the nitride-oxide-nitride stack 136 is formed. If copper is used as the last metal with a non-silicided copper surface, then all three layers of the nitride-oxide-nitride stack 136 should be used. Note that any standard inorganic dielectric stack could be used in place of the nitride-oxide-nitride stack 136. The nitride-oxide-nitride stack 136 protects the otherwise exposed surfaces against oxidation, mobile ions, and contaminants. For example, the metallic etch stops 75 and 76 may be susceptible to oxidation if exposed to air.

The first nitride layer has a thickness preferably between about 10 nm and about 100 nm, and optimally about 35 nm.

The oxide layer has a thickness preferably between about 250 nm and about 1000 nm, and optimally about 500 nm. The second nitride layer has a thickness preferably between about 250 nm and about 1000 nm, and optimally about 500 nm. Each of the first nitride layer, the oxide layer, and the second nitride layer may be formed by any method known to one of ordinary skill in the art, including plasma enhanced chemical vapor deposition (PECVD) which is the preferred method, high density plasma chemical vapor deposition (HDPCVD), spin-on, and physical vapor deposition (PVD).

The polyimide layer 137 has a thickness between about 1 microns and about 25 microns, and preferably about 5 microns. The polyimide layer 137 may be formed by any method known to one of ordinary skill in the art, such as by spin-on with cure processing.

Figure 7:
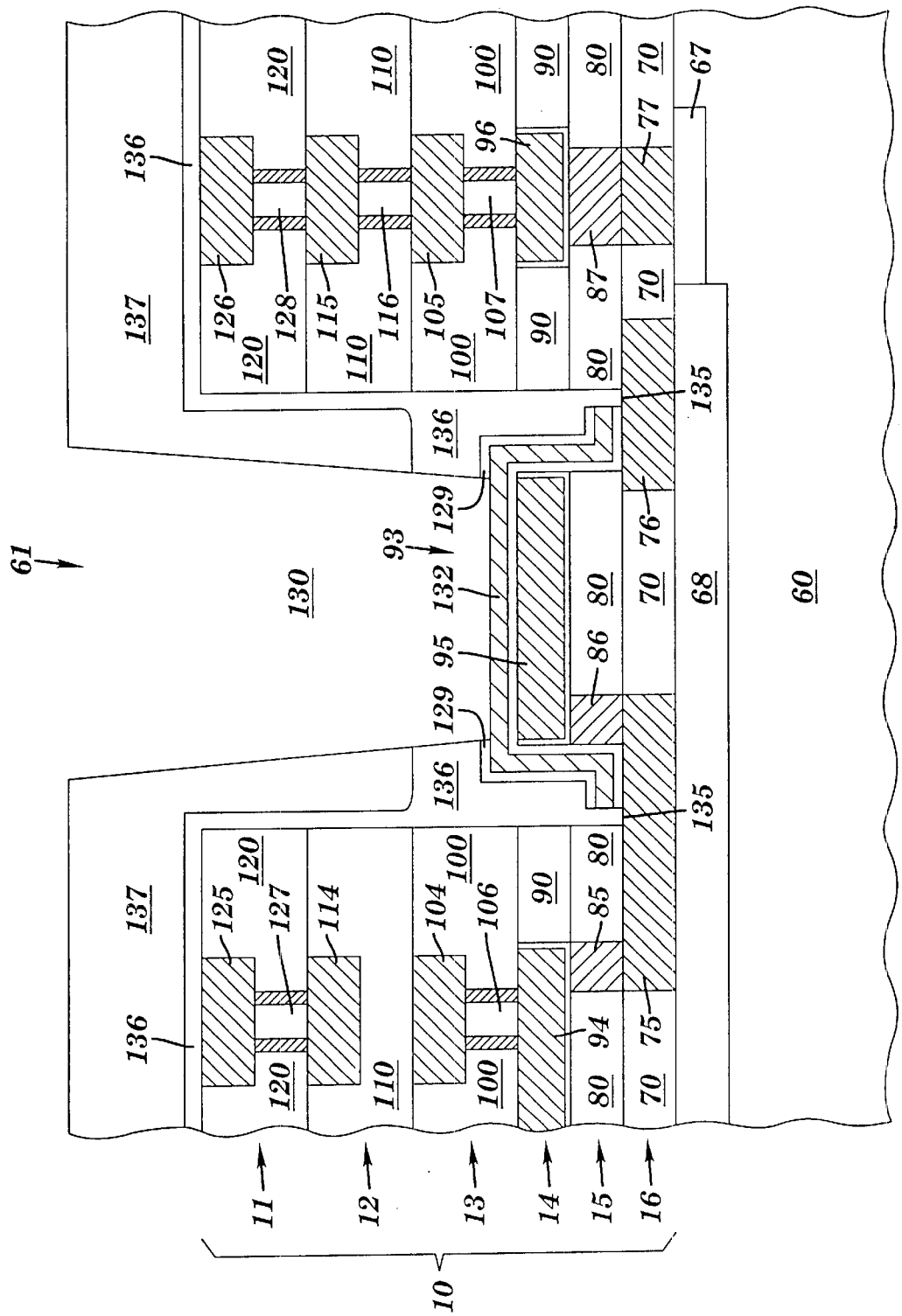
FIG. 7 depicts FIG. 6 after a portion of the polyimide layer and a portion the nitride-oxide-nitride stack has been etched away, resulting in exposure of a portion of the conductive layer.

FIG. 7 illustrates FIG. 6 after a portion of the polyimide layer 137 and nitride-oxide-nitride stack 136 have been etched away by any method known to one of ordinary skill in the art, such as by photolithographic patterned etching, resulting in exposure of a portion of the conductive layer 132. Suitable etchants as is known in the art include, inter alia, perfluorocarbon-based (e.g., $CF_4$) RIE, or hydrofluorocarbon-based (e.g., $CHF_3$) RIE. Note from FIG. 7 that the etching removes the portion of the protective layer 129 that is over the portion of the conductive layer 132 to be exposed, but remains in locations under the remaining portion of the polyimide layer 137.

Figure 8:
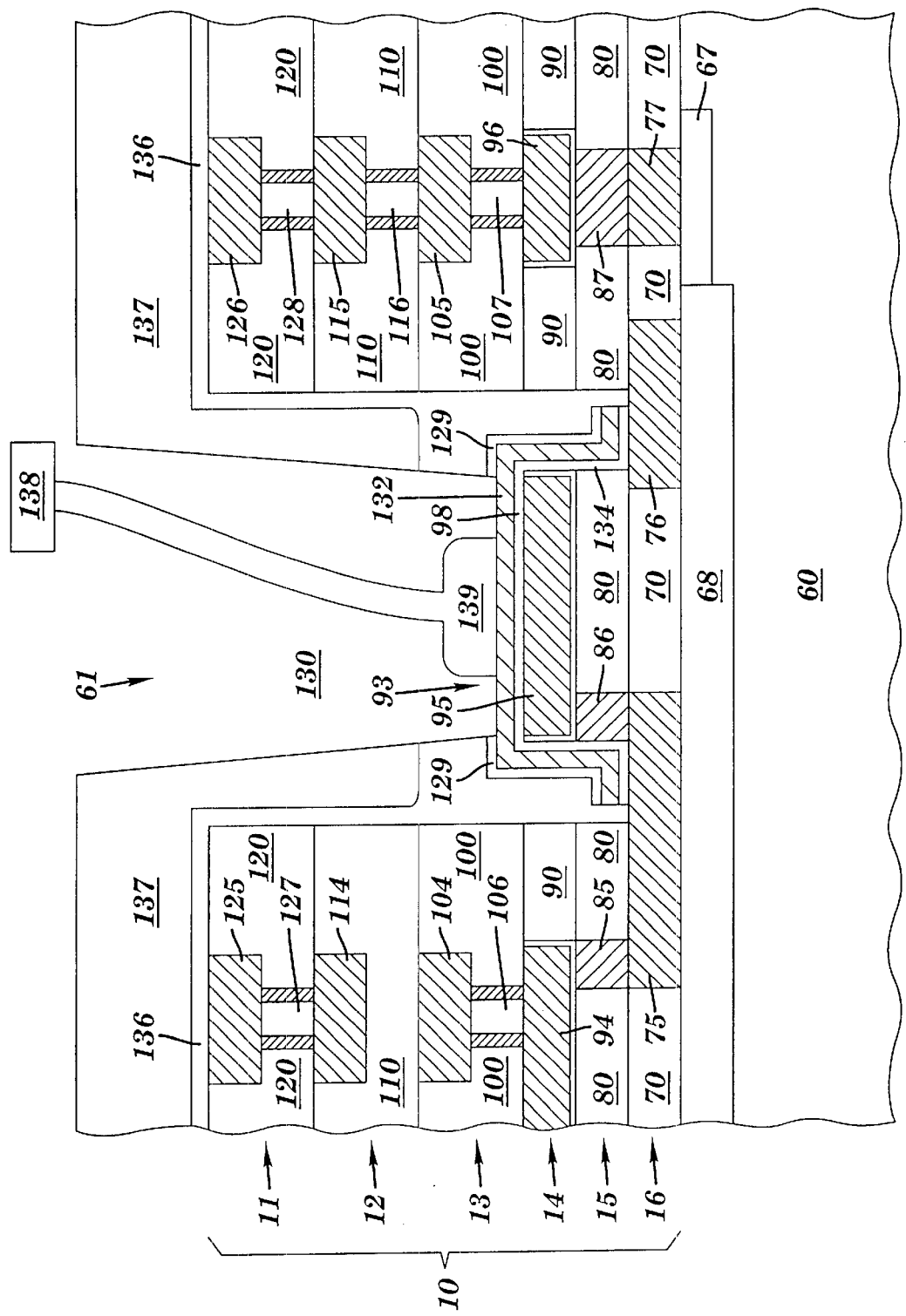
FIG. 8 depicts FIG. 7 after a wirebond and an attached electrical device have been coupled to the exposed portion of the conductive layer.

FIG. 8 illustrates FIG. 7 after a wirebond 139 has been mechanically and conductively coupled to an exposed portion of the bond pad 93 (i.e., to the exposed portion of the conductive layer 132). FIG. 8 also shows the wirebond 139 as conductively coupling the bond pad 93 to an electrical device 138 such as a semiconductor device (e.g., a transistor), inasmuch as the wirebond 139 is conductively coupled to the electrical device 138. It should be recalled that FIG. 8 illustrates a cross-sectional view taken along line 2—2 of FIG. 1.

Although FIGS. 2–8 show 6 levels, the view 2—2 requires only as few as 3 levels, namely levels 16, 15, and 14. Level 16 is necessary, because level 16 includes the metallic etch stops 75 and 76, which are necessary to prevent etchant from reacting the substrate 60, as discussed supra in conjunction with FIG. 3. As was discussed supra in conjunction with FIG. 1, and will be further discussed infra in conjunction with FIG. 9, level 15 is necessary, because level 15 includes the metallic etch stops 142 and 143, which are likewise necessary to prevent etchant from reacting the substrate 60. Level 14 must be present, because the present invention requires that the bond pad 93 (which includes the metal pad 95) be at a level above the metallic etch stops and yet depressed below the top surface 24 of the electronic device 61. Note that the view 2—2 may include more than 6 levels; e.g., additional levels may be formed on level 11, or additional levels may be formed between level 16 and the substrate 60. Additionally, there may be more than one intervening level between the bond pad 93 and the level 16 that includes the metallic etch stops 75 and 76, provided that there is conductive coupling between the bond pad 93 and the metallic etch stop 75 (such as by the conductive layer 132 or by a continuum of intervening conductive regions analogous to the metal region 86).

FIG. 9 illustrates a cross-sectional view taken along line 9—9 of FIG. 1 ("view 9—9") showing the electronic device 61 having the recessed bond pad 93. The same fabrication methods described supra in conjunction with FIGS. 2–8 (view 2—2 of FIG. 1) are used to obtain the structure shown in FIG. 9. FIG. 9 includes the same system 10 of 6 contiguous levels (11, 12, 13, 14, 15, and 16) of interconnect metallurgy on the same substrate 60 as appears in FIGS. 2–8. The bond pad 93 (conductive layer 132 over metal pad 95) within the cylindrical space 130, as depicted and described supra in FIGS. 2–8, is shown in FIG. 9 along with the nitride-oxide-nitride stack 136, the polyimide layer 137, the conductive interconnect 139, and the electrical device 138. For simplicity, FIG. 9 has omitted the conductive liner 98, conductive film 134, and protective layer 129, which appear in FIG. 8 and should likewise appear in FIG. 9.

Level 16 of FIG. 9 includes a dielectric region 147 which preferably includes the dielectric material BPSG, PSG, or $SiO_2$ as discussed previously. Level 15 of FIG. 9 includes a dielectric region 140 and metallic etch stops 142 and 143. The dielectric material of the dielectric region 140 preferably includes PSG or $SiO_2$ as discussed previously. The metallic etch stops 142 and 143 each preferably include tungsten. Because of the metallic etch stops 142 and 143, the etching described supra in conjunction with FIG. 3 etches through levels 11–14 for the view 9—9 shown in FIG. 9, in contrast with the etching through levels 11–15 for the view 2—2 shown in FIGS. 2–8.

Level 14 of FIG. 9 includes a dielectric region 150, and metal pads and wires 152 and 95. The metal pad and wire 152 is conductively coupled to the metallic etch stop 142 of level 15. The dielectric region 150 may include either a mechanically strong dielectric material or a mechanically weak dielectric material for the same reason that the dielectric region 100 may include either a mechanically strong dielectric material or a mechanically weak dielectric material, as discussed supra in relation to level 14 of FIG. 2. The metal pads and wires 152 and 95 each include any conductive metal, and preferably include copper. The level 14 may also include conductive liners (not shown) partially encapsulating the metal pads and wires 152 and 95, which are analogous to the conductive liners 97, 98, and 99 shown in FIG. 3.

Level 13 of FIG. 9 includes a dielectric region 160. As with level 14, the dielectric region 160 may include a mechanically strong dielectric material or a mechanically weak dielectric material. Level 13 also includes a plated via 163 (e.g., a copper plated via) conductively coupled to a metal pad 162, wherein the plated via 163 is also conductively coupled to the metal pad 152 of level 14. The metal pad 162 includes any conductive metal, and preferably includes copper. The metal pad 162 includes also includes a conductive liner (not shown) such as any of the conductive liners 97, 98, and 99 of level 14 shown in FIG. 2.

Level 12 of FIG. 9 includes a dielectric region 170. As with level 14, the dielectric region 170 may include a mechanically strong dielectric material or a mechanically weak dielectric material. Level 12 also includes a plated via 173 (e.g., a copper plated via) conductively coupled to a metal pad 172, wherein the plated via 173 is also conductively coupled to the metal pad 162 of level 13. The metal pad 172 includes any conductive metal, and preferably includes copper. The metal pad 172 includes also includes a conductive liner (not shown) such as any of the conductive liners 97, 98, and 99 of level 14 shown in FIG. 2.

Level 11 of FIG. 9 includes a dielectric region 180. As with level 14, the dielectric region 180 may include a mechanically strong dielectric material or a mechanically weak dielectric material. Level 11 also includes a plated via 183 (e.g., a copper plated via) conductively coupled to a metal pad and wire 182, wherein the plated via 183 is conductively coupled to the metal pad 172 of level 12. The metal pad 182 includes any conductive metal, and preferably includes copper. The metal pad 182 includes also includes a conductive liner (not shown) such as any of the conductive liners 97, 98, and 99 of level 14 shown in FIG. 2.

A distinctive feature of the method of the present invention relates to how the metallic etch stops 75 and 76 in the 2—2 view shown in FIG. 8 cooperate with the metallic etch stops 142 and 143 in the view 9—9 shown in FIG. 9 to prevent the etchant of the etching process described supra in connection with FIG. 3 from reaching, and thus etching, the substrate 60. FIG. 8 shows that etch stops 75 and 76 in level 16 are effective etch stops in the 2—2 view of the device 61. Similarly, FIG. 9 shows that etch stops 142 and 143 in level 15 are effective etch stops in the 9—9 view of the device 61. FIG. 1 shows that etch stop 75 and etch stop 142 overlap in the direction 21, and that the etch stop 76 and etch stop 143 also overlap in the direction 21. Because of these overlaps, there are no spatial pathways to the substrate 60 through which etchant can flow. Thus, etch stops 75, 142, 76, and 143 form an overlapping multilevel matrix pattern that constitutes a total etch stop for the etching process described supra in connection with FIG. 3.

Although FIG. 9 shows 6 levels, the view 9—9 requires only as few as 2 levels, namely levels 15 and 14. Level 15 is necessary, because level 15 includes the metallic etch stops 142 and 143, which are necessary to prevent etchant from reacting the substrate 60, as discussed supra. Level 14 must be present, because the present invention requires that the bond pad 93 (which includes the metal pad 95) be at a level above the metallic etch stops and yet depressed below the top surface 24 of the electronic device 61. Since view 9—9 requires at least 2 levels (the levels 15 and 14), and since view 2—2 requires at least three level (the levels 16, 15, and 14) as discussed supra in conjunction with FIG. 8, it is concluded the electronic device 61 must have at least 3 levels to support the overlapping multilevel matrix pattern. Note that the view 9—9 may include more than 6 levels; e.g., additional levels may be formed on level 11, or additional levels may be formed between level 16 and the substrate 60.

As an alternative to the overlapping multilevel matrix pattern of metallic etch stops, the electronic device 61 may have a simplified structural pattern such that all vertical cross-sectional views in FIG. 1 that cut through the bond pad 93 have metallic etch stops in level 16 only. With the simplified structural pattern, the view 9—9 is replaced by a structure that is similar to the structure of the view 2—2, such that there are no required metallic etch stops in level 15, and all required metallic etch stops are in level 16, as depicted in view 2—2. Accordingly, the simplified structural pattern does not require the overlapping multilevel matrix pattern that characterizes the combination of views 2—2 and 9—9 discussed supra. Also with the simplified structural pattern, the electronic device 61 may have as few as 2 levels; i.e., level 15 could be eliminated and the bond pad 93 could rest directly on metallic etch stops in level 16, such as the metallic etch stops 75 and 76 shown in FIG. 8. Thus, the electronic device 61 must have at least 2 levels with the simplified structural pattern, and at least 3 levels with the overlapping multilevel matrix pattern. Alternatively, a simplified structural pattern could be employed in level 16, with the result that level 16 could be eliminated.

The preceding FIGS. 1–9, and the discussions supra accompanying FIGS. 1–9, provide a basis for the following mathematical notation for describing the level structure of an electronic device that utilizes the overlapping multilevel matrix pattern of metallic etch stops. The electronic device includes N contiguous levels (i.e., levels 1, 2, . . . , N) of interconnect metallurgy on a substrate such that level N is coupled to the substrate and level 1 is furthest from the substrate. N is at least 3 (e.g., N=6 in FIGS. 2–9). Each level is formed at a different elevation above the substrate. There is a first group of metallic etch stops at level M, and a second group of metallic etch stops at level M−1, wherein $3 \leq M \leq N$ (e.g., M=N=6 in FIGS. 2–9). The first group of metallic etch stops is exemplified by the metallic etch stops 75 and 76 in the view 2—2 shown in FIGS. 2–8. The second group of metallic etch stops is exemplified by the metallic etch stops 142 and 143 in the view 9—9 shown in FIG. 9. The second group of metallic etch stops conductively contacts the first group of metallic etch stops in an overlapping multilevel matrix pattern. A cylindrical space (e.g., the cylindrical space 130 in FIGS. 2–9) encompasses: levels 1, 2, . . . , M−1 above the first group of metallic etch stops, and levels 1, 2, . . . , M−2 above the second group of metallic etch stops. A bond pad is substantially formed at level K within the cylindrical space, wherein $1 \leq K \leq M-2$. The bond pad is conductively coupled to both the first group of metallic etch stops and the second group of metallic etch stops. In FIGS. 2–9, K=M−2=4. The bond pad includes a surface having an exposed portion.

The preceding FIGS. 1–9, and the discussions supra accompanying FIGS. 1–9, provide a basis for the following mathematical notation for describing the level structure of an electronic device that utilizes the simplified structural pattern of metallic etch stops. The electronic device includes N contiguous levels (i.e., levels 1, 2, . . . , N) of interconnect metallurgy on a substrate such that level N is coupled to the substrate and level 1 is furthest from the substrate. N is at least 2 (e.g., N=6 in FIGS. 2–9). Each level is formed at a different elevation above the substrate. There is a group of metallic etch stops at level M, wherein $2 \leq M \leq N$ (e.g., M=N=6 in FIGS. 2–9). The group of metallic etch stops is exemplified by the metallic etch stops 75 and 76 in the view 2—2 shown in FIGS. 2–8. A cylindrical space (e.g., the cylindrical space 130 in FIGS. 2–9) encompasses levels 1, 2, . . . , M−1 above the group of metallic etch stops. A bond pad is substantially formed at level K within the cylindrical space, wherein $1 \leq K \leq M-1$. The bond pad is conductively coupled to the group of metallic etch stops. In FIGS. 2–9, K=M−2=4. The bond pad includes a surface having an exposed portion.

FIG. 10 illustrates a cross-sectional view taken along line 10—10 of FIG. 1 ("view 10—10") showing the electronic device 61 having the recessed bond pad 93. The same fabrication methods described supra in conjunction with FIGS. 2–8 (view 2—2 of FIG. 1) are used to obtain the structure shown in FIG. 10. FIG. 10 includes the same system 10 of 6 contiguous levels (11, 12, 13, 14, 15, and 16) of interconnect metallurgy on the same substrate 60 as appears in FIG. 2–8. The bond pad 93 (conductive layer 132 over metal pad 95) within the cylindrical space 130, as depicted and described supra in FIGS. 2–8, is shown in FIG. 10 along with the nitride-oxide-nitride stack 136, the polyimide layer 137, the conductive interconnect 139, and the electrical device 138. For simplicity, FIG. 10 has omitted the conductive liner 98, conductive liner 134, and protective layer 129, which appear in FIG. 8 and should also appear in FIG. 10.

Level 16 of FIG. 10 includes a dielectric region 610 and metallic etch stops 612 and 613. The dielectric material of the dielectric region 610 preferably includes BPSG. The metallic etch stops 612 and 613 each preferably include tungsten.

Level 15 of FIG. 10 includes a dielectric region 620, and metallic etch stops 622 and 623 mechanically and conductively coupled to the metallic etch stops 612 and 613, respectively, of level 16. The dielectric material of the dielectric region 620 preferably includes PSG or $SiO_2$ as discussed previously. The metallic etch stops 622 and 623 each preferably include tungsten.

Level 14 of FIG. 10 includes a dielectric region 630. The dielectric region 630 may include either a mechanically strong dielectric material or a mechanically weak dielectric material for the same reason that the dielectric region 100 may include either a mechanically strong dielectric material or a mechanically weak dielectric material, as discussed supra in relation to level 14 of FIG. 2. Levels 13, 12, and 11 include dielectric regions 640, 650, and 660, respectively. As with level 14, the dielectric regions 640, 650, and 660 may each include a mechanically strong dielectric material or a mechanically weak dielectric material. Note that conductive structure, such as plated vias and metal pads as are shown in FIGS. 8 and 9, are not shown on levels 14, 13, 12, and 11 of FIG. 10, even though levels 14, 13, 12, and 11 of the view 10—10 shown in FIG. 10 may include such conductive structure.

The view 10—10 is distinctive in having metallic etch stops in both level 16 (i.e., etch stops 612 and 613) and level 15 (i.e., etch stops 622 and 623) within the same vertical cross-sectional slice of the electronic device 61. This is in contrast with the views 2—2 and 9—9 shown in FIG. 8 and FIG. 9, respectively, which collectively require metallic etch stops at level 16 (i.e., etch stops 75 and 76) in one cross-sectional view (i.e., view 2—2) and metallic etch stops at level 15 (i.e., etch stops 142 and 143) in another cross-sectional view (i.e., view 9—9).

Figure 11:
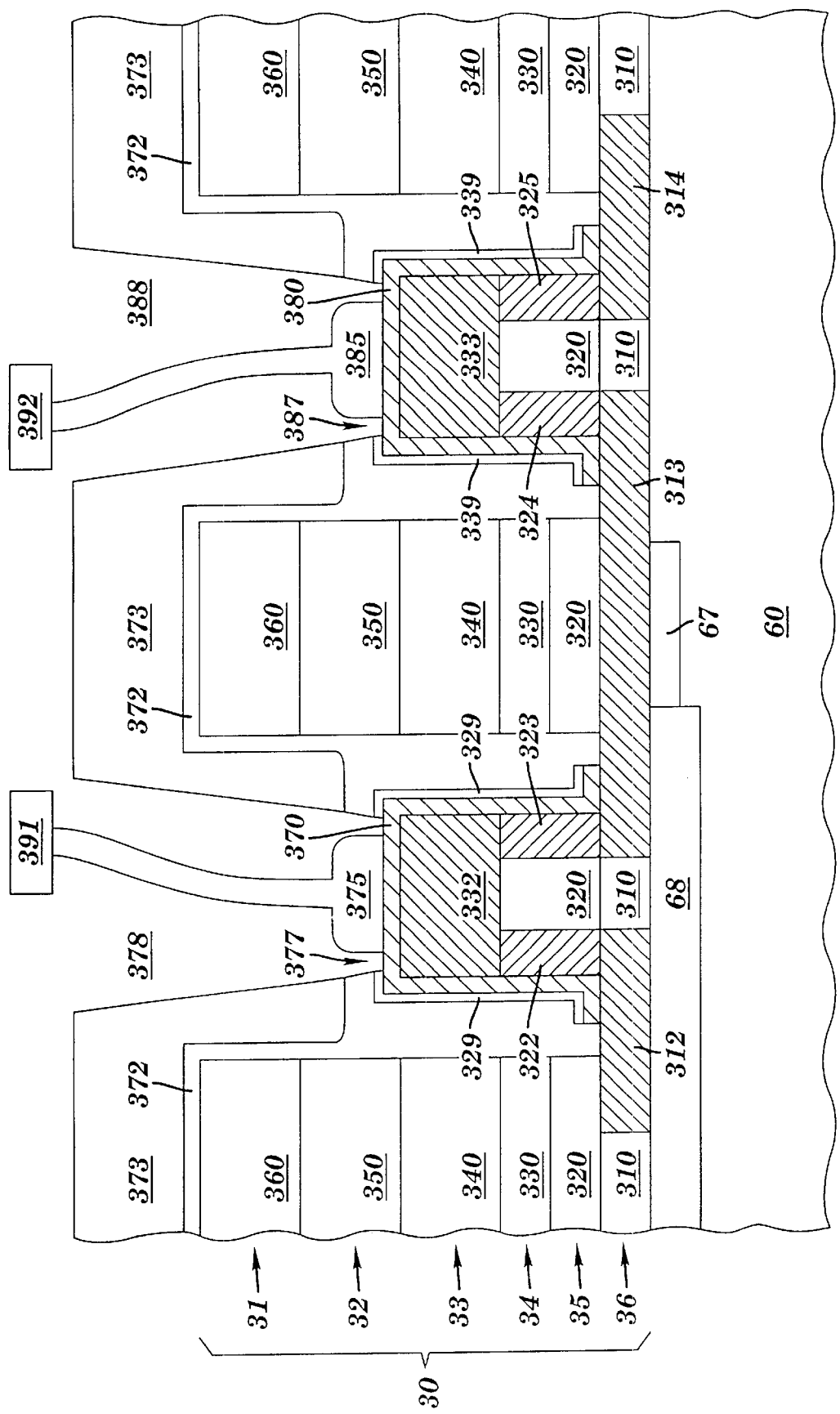
FIG. 11 depicts a front cross-sectional view of an electronic device having, two conductively coupled bond pads, in accordance with a preferred embodiment of the present invention.

FIG. 11 illustrates a front cross-sectional view of an electronic device 63 having a recessed bond pad 377 (within a cylindrical space 378) conductively coupled to a recessed bond pad 387 (within a cylindrical space, or equivalently "cylindrical volume," 388), in accordance with a preferred embodiment of the present invention. The recessed bond pad 387 includes a conductive layer 370 over a metal pad 332. The recessed bond pad 387 includes a conductive layer 380 over a metal pad 333. This embodiment utilizes an overlapping multilevel matrix pattern of metallic etch stops. Noting that FIG. 11 is analogous to the view 2—2 shown in FIG. 8, there is another cross-sectional view (not shown here) of the embodiment of FIG. 11 that is analogous to the view 9—9 shown in FIG. 9.

FIG. 11 includes a system 30 of 6 contiguous levels of interconnect metallurgy on the same substrate 60 as appears in FIGS. 2–10. The 6 contiguous levels are each formed at a different elevation above the substrate 60. The 6 contiguous levels include levels 31, 32, 33, 34, 35, and 36 in order of decreasing elevation above the substrate 60, wherein level 36 is coupled to the substrate 60, and level 31 is furthest from the substrate 60.

Level 36 includes a dielectric region 310 and metallic etch stops 312, 313, and 314. The dielectric material of the dielectric region 310 preferably includes BPSG, PSG, or $SiO_2$ as discussed previously. The metallic etch stops 312, 313, and 314 each preferably include tungsten.

Level 35 includes a dielectric region 320 and metal regions 322, 323, 324, and 325. The dielectric material of the dielectric region 320 preferably includes PSG or $SiO_2$ as discussed previously. The metal regions 322 and 323, which include any conductive metal and preferably include tungsten, are conductively coupled to the etch stops 312 and 313, respectively, of level 36. The metal regions 324 and 325, which include any conductive metal and preferably include tungsten, are conductively coupled to the etch stops 313 and 314, respectively, of level 36.

Level 34 includes a dielectric region 330, and metal pads 332 and 333. The metal pad 332 is conductively coupled to the metal regions 322 and 323 of level 35. The metal pad 333 is conductively coupled to the metal regions 324 and 325 of level 35. The dielectric region 330 may include either a mechanically strong dielectric material or a mechanically weak dielectric material for the same reason that the dielectric region 100 may include either a mechanically strong dielectric material or a mechanically weak dielectric material, as discussed supra in relation to level 14 of FIG. 2. The metal pads 332 and 333 each include any conductive metal, and preferably include copper. The level 34 may also include conductive liners (not shown) partially encapsulating the metal pads 332 and 333, which are analogous to the conductive liners 97, 98, and 99 shown in FIG. 3. The recessed bond pad 377, which includes the conductive layer 370 and the metal pad 332, is substantially at level 34 for the same reasons that the recessed bond pad 93 is substantially at level 14, as discussed supra in relation to FIG. 5. The recessed bond pad 387, which includes the conductive layer 380 and the metal pad 333, is substantially at level 34 for the same reasons that the recessed bond pad 93 is substantially at level 14, as discussed supra in relation to FIG. 5.

Levels 33, 32, and 31 include dielectric regions 340, 350, and 360, respectively. As with level 34, the dielectric regions 340, 350, and 360, may each include a mechanically strong dielectric material or a mechanically weak dielectric material. In addition, FIG. 11 shows the protective layers 329 and 339 formed on the conductive layers 370 and 380, respectively, which is analogous to the protective layer 129 on the conductive layer 132 of FIG. 8. FIG. 11 also shows the nitride-oxide-nitride stack 372, which is analogous to the nitride-oxide-nitride stack 136 of FIG. 8. FIG. 11 further shows polyimide layers 373, which is analogous to the polyimide layer 137 of FIG. 8. Additionally, FIG. 11 shows conductive interconnect 375 conductively coupling an electrical device 391 such as a semiconductor device (e.g., a transistor) to the bond pad 377. FIG. 11 also shows the conductive interconnect 385 conductively coupling an electrical device 392 such as a semiconductor device (e.g., a transistor) to the bond pad 387.

From the preceding discussion, it is seen that the recessed bond pad 377 is conductively coupled to the recessed bond pad 387 by the following conductive path through the electronic device 63: bond pad 377, to metal region 323, to metallic etch stop 313, to metal region 324, to bond pad 387. The preceding conductive path was merely illustrative, and any conductive path within the electronic device 63 that conductively couples the bond pad 377 to the bond pad 387 is within the scope of the present invention. The electronic device 63 illustrates an example in which the two recessed bond pads 377 and 387 are both at the same level 34. The electronic device 63 also illustrates an example in which the two recessed bond pads 377 and 387 are conductively coupled to the different electrical devices 391 and 392.

Figure 12:
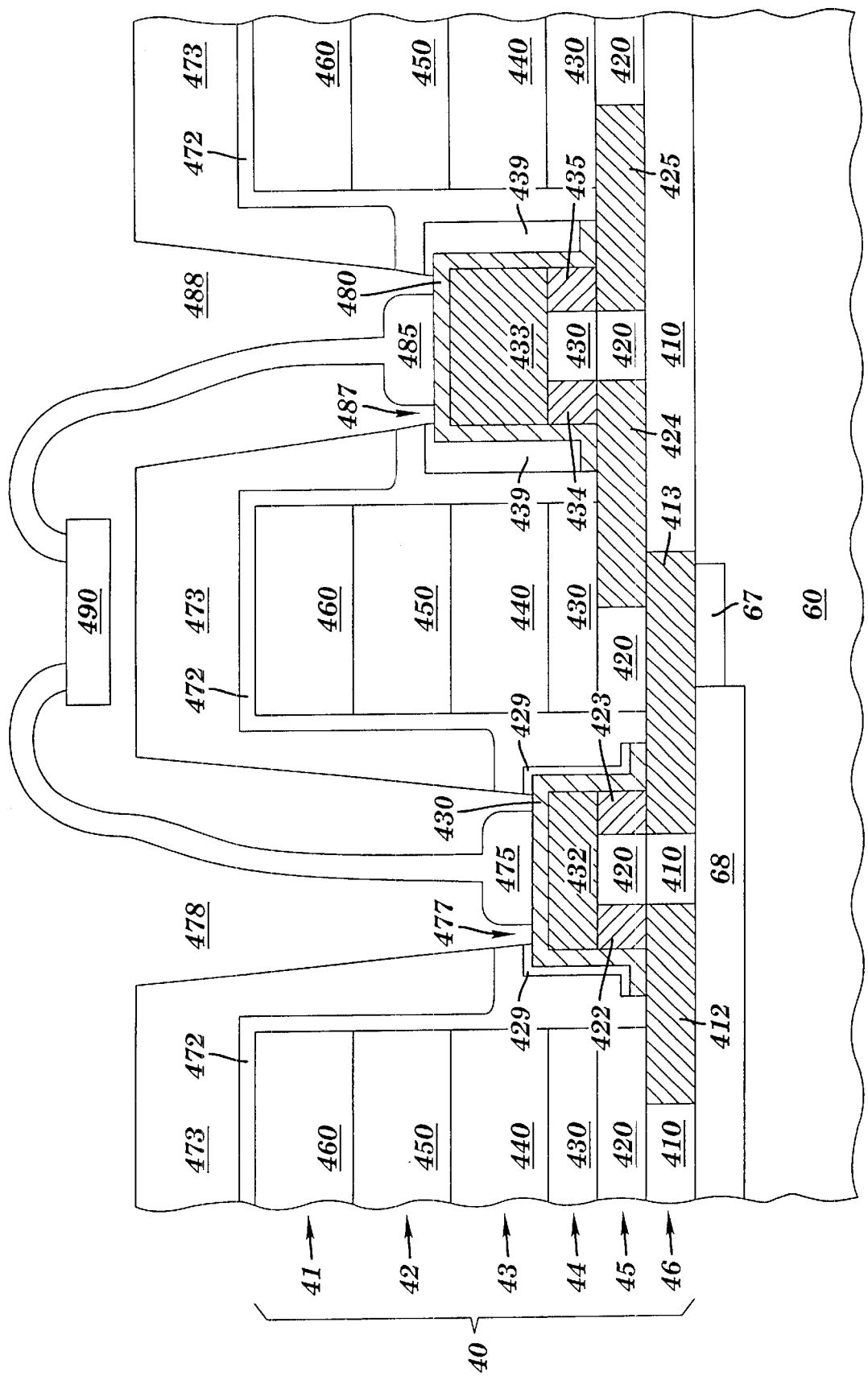
FIG. 12 depicts a front cross-sectional view of an electronic device having two conductively coupled bond pads, in accordance with a preferred embodiment of the present invention.

FIG. 12 depicts a front cross-sectional view of an electronic device 64 having a recessed bond pad 477 (within a cylindrical space 478) conductively coupled to a recessed bond pad 487 (within a cylindrical space, or equivalently "cylindrical volume," 488), in accordance with a preferred embodiment of the present invention. The recessed bond pad 477 includes a conductive layer 470 over a metal pad 432. The recessed bond pad 487 includes a conductive layer 480 over a metal pad 433. This embodiment utilizes an overlapping multilevel matrix pattern of metallic etch stops. Noting that FIG. 12 is analogous to the view 2—2 shown in FIG. 8, there is another cross-sectional view (not shown here) of the embodiment of FIG. 11 that is analogous to the view 9—9 shown in FIG. 9.

FIG. 12 includes a system 40 of 6 contiguous levels of interconnect metallurgy on the same substrate 60 as appears in FIGS. 2–10. The 6 contiguous levels are each formed at a different elevation above the substrate 60. The 6 contiguous levels include levels 41, 42, 43, 44, 45, and 46 in order of decreasing elevation above the substrate 60, wherein level 46 is coupled to the substrate 60, and level 41 is furthest from the substrate 60.

Level 46 includes a dielectric region 410 and metallic etch stops 412 and 413. The dielectric material of the dielectric region 410 preferably includes BPSG. The metallic etch stops 412 and 413 each preferably include tungsten.

Level 45 includes a dielectric region 420, metal regions 422 and 423, and metallic etch stops 424 and 425. The dielectric material of the dielectric region 420 preferably includes PSG. The metal regions 422 and 423, which include any conductive metal and preferably include tungsten, are conductively coupled to the metallic etch stops 412 and 413, respectively, of level 46. The metallic etch stops 424 and 425 each preferably include tungsten. The metallic etch stop 424 is conductively coupled to the metallic etch stop 413 of level 46.

Level 44 includes a dielectric region 430, a metal pad 432, and metal regions 434 and 435. The metal pad 432 is conductively coupled to the metal regions 422 and 423 of level 45. The metal regions 434 is conductively coupled to the metallic etch stop 424 of level 45. The metal regions 435 is conductively coupled to the metallic etch stop 425 of level 45. The dielectric region 430 preferably includes PSG. The metal pad 432 includes any conductive metal, and preferably include copper. The metal regions 434 and 435 preferably include tungsten. The level 44 may also include a conductive liner (not shown) partially encapsulating the metal pad 432, in analogy to the conductive liners 97, 98, and 99 shown in FIG. 3. The recessed bond pad 477, which includes the conductive layer 470 and the metal pad 432, is substantially at level 44 for the same reasons that the recessed bond pad 93 is substantially at level 14, as discussed supra in relation to FIG. 5.

Level 43 includes a dielectric region 440 and a metal pad 433. The metal pad 433 is conductively coupled to the metal regions 434 and 435 of level 44. The dielectric region 440 may include either a mechanically strong dielectric material or a mechanically weak dielectric material for the same reason that the dielectric region 100 may include either a mechanically strong dielectric material or a mechanically weak dielectric material, as discussed supra in relation to level 14 of FIG. 2. The metal pad 433 includes any conductive metal, and preferably includes copper. The level 43 may also include a conductive liner (not shown) partially encapsulating the metal pad 433, in analogy to the conductive liners 97, 98, and 99 shown in FIG. 3. The recessed bond pad 487, which includes the conductive layer 480 and the metal pad 433, is substantially at level 43 for the same reasons that the recessed bond pad 93 is substantially at level 14, as discussed supra in relation to FIG. 5.

Levels 42 and 41 include dielectric regions 450 and 460, respectively. As with level 43, the dielectric regions 450 and 460 may each include a mechanically strong dielectric material or a mechanically weak dielectric material.

FIG. 12 shows the protective layers 429 and 439 formed on the conductive layers 470 and 480, respectively, which is analogous to the protective layer 129 on the conductive layer 132 of FIG. 8. FIG. 12 also shows the nitride-oxide-nitride stack 472, which is analogous to the nitride-oxide-nitride stack 136 of FIG. 8. FIG. 12 further shows a polyimide layer 473, which is analogous to the polyimide layer 137 of FIG. 8. Additionally, FIG. 12 shows a conductive interconnect 475 conductively coupling an electrical device 490 such as a semiconductor device (e.g., a transistor) to the bond pad 477. FIG. 12 also shows a conductive interconnect 485 conductively coupling the electrical device 490 to the bond pad 487.

From the preceding discussion, it is seen that the recessed bond pad 477 is conductively coupled to the recessed bond pad 487 by the following conductive path through the electronic device 64: bond pad 477, to metal region 423, to metallic etch stop 413, to metallic etch stop 424, to metal region 434, to bond pad 487. The preceding conductive path was merely illustrative, and any conductive path within the electronic device 64 that conductively couples the bond pad 477 to the bond pad 487 is within the scope of the present invention. The electronic device 64 illustrates an example in which the two recessed bond pads 477 and 487 are both substantially at different levels, namely levels 44 and 43, respectively. The electronic device 63 also illustrates an example in which the two recessed bond pads 477 and 487 are conductively coupled the same electrical device 490.

While FIGS. 1–10 show one recessed bond pad, and FIGS. 11–12 show two recessed bond pads, an electronic device of the present invention may include any number of bond pads.

While preferred and particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

We claim:

1. An electronic device, comprising:
   a substrate;
   a system of N contiguous levels of interconnect metallurgy on the substrate, wherein each level is formed at a different elevation above the substrate, wherein level N is coupled to the substrate, and wherein N is a positive integer of at least 3;
   a first group of metallic etch stops at level M, wherein M is an integer no less than 3 and no greater than N;
   a second group of metallic etch stops at level M−1, wherein the second group of metallic etch stops conductively contacts the first group of metallic etch stops in an overlapping multilevel matrix pattern;
   a cylindrical space that encompasses:
      levels 1, 2, . . . , M−1 above the first group of metallic etch stops, and
      levels 1, 2, . . . , M−2 above the second group of metallic etch stops;
   a first bond pad of a plurality of bond pads within the first cylindrical space, wherein the first bond pad is substantially formed at level K, wherein K is a positive integer of at least 1 and no greater than M−2, wherein the first bond pad is conductively coupled to both the first group of metallic etch stops and the second group of metallic etch stops, and wherein the first bond pad includes a surface having an exposed portion;

a third group of metallic etch stops at level MM, wherein MM is an integer no less than 3 an no greater than N;

a fourth group of metallic etch stops at level MM−1 wherein the fourth group of metallic etch stops conductively contacts the third group of metallic etch stops in an overlapping multilevel matrix pattern;

a cylindrical volume that encompasses: levels 1, 2, . . . , MM−1 above the third group of metallic etch stops, and levels 1, 2, . . . , MM−2 above the fourth group of metallic etch stops; and a second bond pad within the cylindrical volume, wherein the second bond pad is substantially formed at level KK, wherein KK is a positive integer of at least 1 and no greater than MM−2, wherein the second bond pad is conductively coupled to both the third group of metallic etch stops and the fourth group of metallic etch stops, and wherein the second bond pad includes a surface having an exposed portion, and wherein the second bond pad is conductively coupled to the bond pad by a conductive path through a portion of the system of the N contiguous levels.

2. The electronic device of claim 1, wherein MM=M, and wherein KK=K.

3. The electronic device of claim 1, further comprising: a first electrical device conductively coupled to the bond pad by use of a first connective interconnect, and a second electrical device conductively coupled to the second bond pad by use of a second connective interconnect.

4. The electronic device of claim 1, further comprising: an electrical device conductively coupled to the bond pad by use of a first connective interconnect, and the electrical device conductively coupled to the second bond pad by use of a second connective interconnect.

5. An electronic device, comprising:

a substrate;

a system of N contiguous levels of interconnect metallurgy for interconnecting semiconductor devices, wherein the system is on the substrate such that level N is coupled to the substrate, wherein N a positive integer of at least 2, and wherein each level is formed at a different elevation above the substrate; and a plurality of bond pads coupled to the system, wherein at least one of said bond pads is substantially formed at level M, and wherein M is a positive integer less than N; and wherein at least two of said bond pads are substantially formed at different levels of the N levels.

6. An electronic device, comprising:

a substrate;

a system of N contiguous levels of interconnect metallurgy for interconnecting semiconductor devices, wherein the system is on the substrate such that level N is coupled to the substrate, wherein N is a positive integer of at least 2, and wherein each level is formed at a different elevation above the substrate; and a plurality of bond pads coupled to the system, wherein at least one of said bond pads is substantially formed at level M, and wherein M is a positive integer less than N; and wherein the at least one of said bond pads is in electrically conductive contact with a metal region located in level M+1, and wherein the at least one of said bond pads is in contact with a dielectric region located in level M+1.

7. An electronic device, comprising:

a substrate;

a system of N contiguous levels of interconnect metallurgy for interconnecting semiconductor devices, wherein the system is on the substrate such that level N is coupled to the substrate, wherein N is a positive integer of at least 2, and wherein each level is formed at a different elevation above the substrate; and a plurality of bond pads coupled to the system, wherein at least one of said bond pads is substantially formed at level M, and wherein, M is a positive integer less than N; and further comprising:

a first conductive interconnect mechanically and conductively coupled to an exposed portion of a first bond pad of said bond pads;

a first electrical device conductively coupled to the first conductive interconnect;

a second conductive interconnect mechanically and conductively coupled to an exposed portion of a second bond pad of aid bond pads; and a second electrical device conductively coupled to the second conductive interconnect.

8. An electronic device, comprising:

a substrate;

a system of N contiguous levels of interconnect metallurgy for interconnecting semiconductor devices, wherein the system is on the substrate such that level N is coupled to the substrate, wherein N is a positive integer of at least 2, and wherein each level is formed at a different elevation above the substrate; and a plurality of bond pads coupled to the system, wherein at least one of said bond pads is substantially formed at level M, and wherein M is a positive integer less than N; and further comprising:

a first conductive interconnect mechanically and conductively coupled to an exposed portion of a first bond pad of said bond pads;

a second conductive interconnect mechanically and conductively coupled to an exposed portion of a second bond pad of said bond pads; and an electrical device conductively coupled to both the first conductive interconnect and the second conductive interconnect.

9. An electronic device, comprising:

a substrate;

a system of N contiguous levels of for interconnect metallurgy for interconnecting semiconductor devices, wherein the system is on the substrate such that level N is coupled to the substrate, wherein N is a positive integer of at least 2, and wherein each level is formed at a different elevation above the substrate; and a plurality of bond pads coupled to the system, wherein at least one of said bond pads is substantially formed at level M, wherein M is a positive integer not greater than N, and wherein a portion of the system is above the at least one of said bond pads; and wherein at least two of said bond pads are substantially formed at different levels of the N levels.

10. An electronic device, comprising:

a substrate;

a system of N contiguous levels of interconnect metallurgy for interconnecting semiconductor devices, wherein the system is on the substrate such that level N is coupled to the substrate, wherein N is a positive integer of at least 2, and wherein each level is formed at a different elevation above the substrate; and a plurality of bond pads coupled to the system, wherein at least one of said bond pads is substantially formed at level M, wherein M is a positive integer not greater than N, and wherein a portion of the system is above the at least one of said bond pads; and wherein the at least one of said bond pads is in electrically conductive contact with a metal region located in level M+1, and wherein the at least one of said bond pads is in contact with a dielectric region located in level M+1.

11. An electronic device, comprising:

a substrate;

a system of N contiguous levels of interconnect metallurgy for interconnecting semiconductor devices, wherein the system is on the substrate such that level N is coupled to the substrate, wherein N is a positive integer of at least 2, and wherein each level is formed at a different elevation above the substrate; and a plurality of bond pads coupled to the system, wherein at least one of said bond pads is substantially formed at level M, wherein M is a positive integer not greater than N, and wherein a portion of the system is above the at least one of said bond pads; and further comprising:

a first conductive interconnect mechanically and conductively coupled to an exposed portion of a first bond pad of said bond pads;

a first electrical device conductively coupled to the first conductive interconnect;

a second conductive interconnect mechanically and conductively coupled to an exposed portion of a second bond pad of said bond pads; and a second electrical device conductively coupled to the second conductive interconnect.

12. An electronic device, comprising:

a substrate;

a system of N contiguous levels of interconnect metallurgy for interconnecting semiconductor devices, wherein the system is on the substrate such that level N is coupled to the substrate, wherein N is a positive integer of at least 2, and wherein each level is formed at a different elevation above the substrate; and a plurality of bond pads coupled to the system, wherein at least one of said bond pads is substantially formed at level M, wherein M is a positive integer not greater than N, and wherein a portion of the system is above the at least one of said bond pads; and further comprising:

a first conductive interconnect mechanically and conductively coupled to an exposed portion of a first bond pad of said bond pads;

a second conductive interconnect mechanically and conductively coupled to an exposed portion of a second bond pad of said bond pads; and an electrical device conductively coupled to both the first conductive interconnect and the second conductive interconnect.

* * * * *